US012590225B2

(12) United States Patent
Suzuki et al.

(10) Patent No.: US 12,590,225 B2
(45) Date of Patent: Mar. 31, 2026

(54) POLISHING COMPOSITION, POLISHING METHOD, AND METHOD FOR PRODUCING POLISHED SUBSTRATE

(71) Applicant: FUJIMI INCORPORATED, Aichi (JP)

(72) Inventors: Shota Suzuki, Aichi (JP); Jingzhi Chen, Miaoli County (TW)

(73) Assignee: FUJIMI INCORPORATED, Aichi (JP)

( * ) Notice: Subject to any disclaimer, the term of this patent is extended or adjusted under 35 U.S.C. 154(b) by 597 days.

(21) Appl. No.: 17/725,837

(22) Filed: Apr. 21, 2022

(65) Prior Publication Data

US 2022/0348791 A1    Nov. 3, 2022

(30) Foreign Application Priority Data

Apr. 30, 2021    (JP) ................................. 2021-077571
Mar. 24, 2022    (JP) ................................. 2022-047909

(51) Int. Cl.
*C09G 1/02*        (2006.01)
*H01L 21/306*      (2006.01)

(52) U.S. Cl.
CPC .......... *C09G 1/02* (2013.01); *H01L 21/30625* (2013.01)

(58) Field of Classification Search
CPC ............................ C09G 1/02; H01L 21/30625
See application file for complete search history.

(56) References Cited

U.S. PATENT DOCUMENTS

2014/0199841 A1    7/2014  Se
2015/0060400 A1*   3/2015  Tamada ............... C09K 3/1409
                                                   252/79.1

2015/0218709 A1*   8/2015  Yoshizaki ........... H01L 21/3212
                                                   252/79.2
2015/0232705 A1*   8/2015  Kachi .................. C09K 3/1436
                                                   252/79.1
2017/0243752 A1*   8/2017  Yasui ................ H01L 21/31058
2020/0303198 A1    9/2020  Kadohashi et al.
2020/0308449 A1    10/2020 Mae et al.
2021/0139739 A1    5/2021  Yoshizaki et al.
2022/0033680 A1    2/2022  Iwano et al.
2022/0098441 A1*   3/2022  Yoshizaki .............. C09K 13/00

FOREIGN PATENT DOCUMENTS

| | | |
|---|---|---|
| JP | 2014-527298 A | 10/2014 |
| JP | 2020158752 A | 10/2020 |
| JP | 2020164780 A | 10/2020 |
| TW | 201348360 A | 12/2013 |
| WO | 2018168206 A1 | 9/2018 |
| WO | 2020065723 A1 | 4/2020 |

OTHER PUBLICATIONS

Office Action in related TW Application No. 111115603 with a mailing date of Mar. 7, 2025.
Office Action in related JP Application No. 2022-047909 with a mailing date of Jun. 4, 2025.
Office Action in related CN Application No. 111115603 with a mailing date of Oct. 2, 2025.
Notice for Reasons for Refusal for JP Patent Application No. 2022-047909 with a mailing date of Dec. 22, 2025.

* cited by examiner

*Primary Examiner* — Jarrett J Stark
(74) *Attorney, Agent, or Firm* — KATTEN MUCHIN ROSENMAN LLP

(57)                ABSTRACT

According to the present invention, a moderately high polishing speed for a specific material and appropriate ratio of polishing speeds between two or more different materials are achieved in polishing using a polishing composition. The present invention relates to a polishing composition comprising abrasive grains, a water-soluble polymer having no alcoholic hydroxyl group in a side chain, a polyvalent carboxylic acid (salt), and an oxidizing agent, and having a pH of less than 6.

5 Claims, No Drawings

POLISHING COMPOSITION, POLISHING METHOD, AND METHOD FOR PRODUCING POLISHED SUBSTRATE

CROSS-REFERENCE TO RELATED APPLICATION

This application is based on Japanese Patent Application No. 2021-077571 filed on Apr. 30, 2021, and Japanese Patent Application No. 2022-047909 filed on Mar. 24, 2022, the contents of which are incorporated herein by reference.

TECHNICAL FIELD

The present invention relates to a polishing composition, a polishing method and a method for producing a polished substrate.

BACKGROUND ART

In the semiconductor industry, planarization techniques are usually used to improve flatness of semiconductor substrate (for example, wafer) surfaces. Chemical mechanical polishing (CMP) is one of the commonly known planarization techniques. The chemical mechanical polishing technique is a technique for planarizing the surface of an object to be polished (workpiece), such as semiconductor substrates, using a polishing composition containing, for example, abrasive grains such as silica, alumina, and ceria, an anticorrosive, a surfactant, etc.

In recent years, a silicon substrate containing germanium material (hereinafter also referred to as "germanium-containing substrate") has gained popularity as a semiconductor substrate. Therefore, the need for a polishing composition applicable to polishing of the germanium-containing substrate has gradually increased.

Japanese Translation of PCT International Application No. 2014-527298 (corresponding to U.S. Patent Application Publication No. 2014/0199841 A1) discloses a chemical mechanical polishing composition comprising (A) inorganic particles, organic particles, or a mixture or composite thereof, (B) at least one oxidizing agent, and (C) an aqueous medium. Moreover, this literature also discloses that the chemical mechanical polishing composition is applied to chemical mechanical polishing for a material made of germanium element or silicon germanium.

SUMMARY

In the process of chemical mechanical polishing, a high improvement in a polishing speed of a specific material has been required. Moreover, when polishing an object to be polished containing two or more different materials, steps may be formed on the surface of this object to be polished, requiring reduction in these steps. Further, when polishing the object to be polished containing two or more different materials, a phenomenon called dishing in which one material is excessively ground down to below the surface of the other material, may occur, therefore requiring reduction in the dishing.

However, there is a problem of difficulty in reducing the steps and dishing when polishing the object to be polished containing two or more different materials, while achieving a high polishing speed of a specific material, in the chemical mechanical polishing composition of Japanese Translation of PCT International Application No. 2014-527298 (corresponding to U.S. Patent Application Publication No. 2014/0199841 A1).

Then, the present inventors have found, as a result of investigation, that the steps and dishing are related to a polishing speed of each material.

The present invention has been completed in consideration of the above problem, and an object of the present invention is to provide a means capable of realizing moderately a high polishing speed of a specific material and an appropriate range of a ratio of polishing speeds between two or more different materials in polishing using a polishing composition.

One aspect to solve the above problem of the present invention includes the following means.

A polishing composition comprising abrasive grains, a water-soluble polymer having no alcoholic hydroxyl group in a side chain, a polyvalent carboxylic acid (salt), and an oxidizing agent, and having a pH of less than 6.

DETAILED DESCRIPTION OF EMBODIMENTS

Embodiments of the present invention will be described below. Incidentally, the present invention is not limited only to the following embodiments.

In the present description, "X to Y" refers to a range of "X or more and Y or less". Operation and measurement of physical properties, etc., are carried out at room temperature (between 20° C. or higher and 25° C. or lower)/relative humidity of 40% RH or higher and 50% RH or lower, unless otherwise specified.

<Polishing Composition>

One aspect of the present invention relates to a polishing composition comprising abrasive grains, a water-soluble polymer having no alcoholic hydroxyl group in a side chain, a polyvalent carboxylic acid (salt), and an oxidizing agent, an having a pH of less than 6. According to the present invention, in polishing using the polishing composition, a means capable of realizing moderately a high polishing speed for a specific material and an appropriate ratio of polishing speeds between two or more different materials is provided.

The present inventors conjecture the following mechanism by which the above problems can be solved. In the polishing composition according to an aspect of the present invention, the oxidizing agent acts on a specific material in the object to be polished to facilitate polishing of the specific material. Thereby, the oxidizing agent contributes to improving a polishing speed of the specific material (for example, a germanium-containing material, polysilicon, etc.). Moreover, the polyvalent carboxylic acid (salt) also contributes to improving a polishing speed of a specific material (for example, the germanium-containing material, polysilicon, etc.). The reason for this is not known in detail, but is conjectured to be derived from an electrical conductivity in the polishing composition and/or a property of the polyvalent carboxylic acid (salt) itself due to its molecular structure. Then, the water-soluble polymer having no alcoholic hydroxyl group in a side chain adsorbs on the surface of a specific material in an object to be polished, decreases a hydrophilicity of the specific material, and enhances a repulsive force between the polishing composition and the specific material. Therefore, the water-soluble polymer having no alcoholic hydroxyl group in a side chain contributes to reducing the polishing speed of the specific material (for example, the germanium-containing material, polysilicon, etc.). Moreover, the pH of the polishing composition in one aspect of the present invention being less than 6 inhibits excessively a high polishing speed of a specific material (for example, the germanium-containing material, polysilicon, etc.) as well as an excessively low polishing speed of other specific material (for example, silicon oxide, etc.). As a result, in polishing using the polishing composition according to an aspect of the present invention, a polishing speed of a specific material (for example, the germanium-containing material, etc.) become moderately high and not excessively high, and thereby fall in an excellent range. Moreover, an appropriate range of a ratio of polishing speeds is achieved between two or more different materials (for example, between the germanium-containing material and polysilicon, between the germanium-containing material and silicon oxide, etc.). Then, polishing with high polishing efficiency is realized, and reduction on steps and dissing is expected to be favorably achieved as well. Incidentally, the above mechanism is based on a conjecture, and the correctness or incorrectness thereof does not affect the technical scope of the present invention.

Hereinafter, each component that can be contained in the polishing composition, the object to be polished, and the like will be described.

[Abrasive Grains]

The polishing composition of one embodiment of the present invention contains abrasive grains. The abrasive grains act to mechanically polish an object to be polished, thereby increasing a polishing speed.

The abrasive grains are not particularly limited, and may be either inorganic or organic particles. The inorganic particles are not particularly limited, and include, for example, particles made of a metal oxide such as silica, alumina, ceria, titania, and the like. The organic particles are not particularly limited, and include, for example, polymethyl methacrylate (polymethyl methacrylate, PMMA) particles, etc. Among them, the abrasive grains are preferably silica (silica abrasives) and more preferably colloidal silica (colloidal silica abrasives).

The abrasive grains may be surface modified. Since a zeta potential value of abrasive grains such as silica is close to zero under acidic conditions, the abrasive grains do not electrically repel each other and are prone to aggregation under acidic conditions. In contrast, abrasive grains that have been surface modified so as to have a positive or negative zeta potential value that is relatively high even under acidic conditions strongly repel each other and disperse well under acidic conditions, resulting in improving a storage stability of the polishing composition. Then, a polishing speed of a specific material (for example, a germanium-containing material, etc.) and a ratio of polishing speeds between two or more different materials (for example, between the germanium-containing material and a silicon-containing compound other than the germanium-containing material, etc.) fall in more favorable ranges. Such surface-modified abrasive grains can be obtained by mixing the abrasive grains with, for example, a coupling agent having a metal such as aluminum, titanium, or zirconium in the molecular structure, or a coupling agent having a functional group such as a carboxylic acid group, a sulfonic acid group, a phosphonic acid group, or an amino group, and physically adsorbing or chemically bonding it to the surface of the abrasive grains, etc. Further, the abrasive grains such as silica exhibit a negative zeta potential regardless of surface modification, and basically well disperse under basic conditions. However, the surface-modified abrasive grains have a larger absolute value of zeta potential than unmodified abrasive grains, thereby can be more stably dispersed.

The surface-modified abrasive grains are not particularly limited, and abrasive grains with an organic acid functional group covalently bonded (hereinafter also referred to as "with organic acid immobilized") on the surface are preferred. Furthermore, among them, silica with organic acid immobilized on the surface (silica abrasive grains with organic acid immobilized on the surface) is preferred, and colloidal silica with organic acid immobilized on the surface (colloidal silica abrasive grains with organic acid immobilized on the surface) are more preferred. The organic acid functional group may be in the state of an acid or a salt. According to these abrasive grains, a polishing speed of a specific material (for example, the germanium-containing material, etc.) and a ratio of polishing speeds between two or more different materials (for example, between the germanium-containing material and the silicon-containing compound other than the germanium-containing material, etc.) fall within more favorable ranges. Immobilization of the organic acid on the colloidal silica surface is carried out by chemically bonding the functional group of the organic acid on the surface of the colloidal silica. Coexistence of colloidal silica and the organic acid alone cannot immobilize the organic acid on the colloidal silica surface. Immobilization of sulfonic acid that is one of the organic acids on colloidal silica can be carried out by a method described in, for example, "Sulfonic acid-functionalized silica through quantitative oxidation of thiol groups", Chem. Commun. 246-247 (2003). Specifically, colloidal silica with sulfonic acid immobilized on the surface can be obtained by allowing a silane coupling agent having a thiol group, such as 3-mercaptopropyltrimethoxysilane to undergo coupling with colloidal silica followed by oxidation of the thiol group with hydrogen peroxide. The colloidal silica used in Examples of the present application are also produced by this method. Alternatively, if carboxylic acid is to be immobilized on the surface of colloidal silica, a method described in, for example, "Novel Silane Coupling Agents Containing a Photolabile 2-Nitrobenzyl Ester for Introduction of a Carboxy Group on the Surface of Silica Gel", Chemistry Letters, 3, 228-229 (2000), can be applied for the immobilization. Specifically, colloidal silica with carboxylic acid immobilized on the surface can be obtained by allowing a silane coupling agent containing photoreactive 2-nitrobenzyl ester (2-nitrobenzyl ester) to undergo coupling with colloidal silica followed by photoirradiation.

A shape of the abrasive grains is not particularly limited, and may be spherical or non-spherical. Examples of the non-spherical shape are not particularly limited, but include various types of shapes, such as polygonal cylinders such as a triangular and square cylinder, a cylinder, a bale-shaped cylinder with the center of the cylinder bulging more than the edge, a donut-shaped disk with the center of the disk penetrating through, a platy disk, a so-called cocoon-shaped disk with the center having a neck, a so-called aggregated spherical shape with multiple particles integrated together, a japamara shape with multiple particles connected almost in a row, a Kompeito (confetti) shape with multiple protrusions on the surface, a rugby ball shape, and a needle shape that is even thinner than a rugby ball shape, etc. Among them, the shape is preferably the cocoon shape. The cocoon shape results in more favorable ranges of a polishing speed of a specific material (for example, the germanium-containing material, etc.) and a ratio of polishing speeds between two or more different materials (for example, between the germanium-containing material and the silicon-containing compound other than germanium-containing material, etc.).

The average primary particle size of the abrasive grains is not particularly limited, and is preferably 5 nm or larger, more preferably 7 nm or larger, still more preferably 10 nm or larger, even still more preferably 25 nm or larger, and particularly preferably 30 nm or larger. These ranges further improve a polishing speed. Moreover, the average primary particle size of the abrasive grains is not particularly limited, and is preferably 120 nm or smaller, more preferably 80 nm or smaller, still more preferably 50 nm or smaller, and particularly preferably 40 nm or smaller. The average primary particle sizes within these ranges allow a polishing speed of a specific material (for example, the germanium-containing material, etc.) and a ratio of polishing speeds between two or more different materials (for example, between the germanium-containing material and the silicon-containing compound other than the germanium-containing material, etc.) to fall in more favorable ranges. Incidentally, a specific surface area of the abrasive grains can be measured by a BET method, and a value of the average primary particle size of abrasive grains can be calculated based on the specific surface area measured.

The average secondary particle size of abrasive grains is not particularly limited, and is preferably 10 nm or larger, more preferably 20 nm or larger, still more preferably 30 nm or larger, and particularly preferably 50 nm or larger. These ranges more improve a polishing speed. Moreover, the average secondary particle size of the abrasive grains is not particularly limited, and is preferably 250 nm or smaller, more preferably 200 nm or smaller, still more preferably 150 nm or smaller, and particularly preferably 100 nm or smaller. The average secondary particle size in these ranges allow a polishing speed of a specific material (for example, the germanium-containing material, etc.) and a ratio of the polishing speeds between two or more different materials (for example, between the germanium-containing material and the silicon-containing compound other than the germanium-containing material, etc.) to fall in more favorable ranges. A value of the average secondary particle size of abrasive grains can be measured by dynamic light scattering.

The abrasive grains may be a commercially available product or a synthetic product.

One type of abrasive grains may be used alone, or two or more types thereof may be combined for use.

The concentration of the abrasive grains in the polishing composition is not particularly limited, and is preferably 0.01% by mass or higher, more preferably 0.05% by mass or higher, still more preferably 0.1% by mass or higher, and particularly preferably 0.5% by mass or higher, with respect to the total mass of the polishing composition. These ranges improve a polishing speed more and allow a ratio of polishing speeds between two or more different materials (for example, between the germanium-containing material and the silicon-containing compound other than the germanium-containing material, etc.) to fall in a more favorable range. Moreover, the concentration of the abrasive grains in the polishing composition is not particularly limited, and is preferably 20% by mass or lower, more preferably 10% by mass or lower, still more preferably 5% by mass or lower, and particularly preferably 3% or lower, with respect to the total mass of the polishing composition. The concentrations within these ranges allow a polishing speed of a specific material (for example, the germanium-containing materials, etc.) and a ratio of polishing speeds between two or more different materials (for example, between the germanium-containing material and the silicon-containing compound other than the germanium-containing material, etc.) to fall in more favorable ranges.

[Water-Soluble Polymer Having No Alcoholic Hydroxyl Group in a Side Chain]

The polishing composition according to one embodiment of the present invention contains a water-soluble polymer having no alcoholic hydroxyl group in a side chain. The water-soluble polymer having no alcoholic hydroxyl group in a side chain acts so as to reduce a polishing speed of a specific material.

The water-soluble polymer having no alcoholic hydroxyl group in a side chain is not particularly limited as long as it has such a structure, and preferably contains a polyalkylene oxide group in the structure represented by Formula (I) below.

[Formula 1]

$$+C_XH_{2X}O+_n \tag{I}$$

wherein in formula (I) above, X is an integer of 2 or more and n is an integer of 2 or more.

The $C_XH_{2X}$ moiety in formula (I) above represents an alkylene group moiety. The alkylene group moiety may be a linear or branched alkylene group. Moreover, the water-soluble polymer containing the polyalkylene oxide group in the structure represented by formula (I) above may also contain a constituting unit having a linear alkylene group moiety and a constituting unit having a branched alkylene group moiety.

In formula (I) above, X is not particularly limited as long as it is an integer of 2 or more, and is preferably an integer of 3 or more. Further, X is not particularly limited, and is preferably an integer of 12 or less, more preferably an integer of 6 or less, still more preferably an integer of 5 or less, and particularly preferably an integer of 4 or less. Among them, X is particularly preferably 3.

In formula (I) above, n represents the number of repeating units (the number of constituting units). The n is not particularly limited as long as it is an integer of 2 or more, preferably an integer of 4 or more, more preferably an integer of 5 or more, still more preferably an integer of 6 or more, and particularly preferably an integer of 12 or more. Moreover, the n is not particularly limited, and is preferably an integer of 150 or less, more preferably an integer of 100 or less, still more preferably an integer of 50 or less, and particularly preferably an integer of 20 or less.

Using the compound of formula (I) above results in more favorable ranges of a polishing speed of a specific material (for example, the germanium-containing material, etc.) and a ratio of polishing speeds between two or more different materials (for example, between the germanium-containing material and the silicon-containing compound other than the germanium-containing material, etc.).

Moreover, the water-soluble polymer having no alcoholic hydroxyl group in a side chain is preferably a water-soluble polymer having no lactam structure or no alcoholic hydroxyl group in a side chain.

The water-soluble polymers having no alcoholic hydroxyl group in a side chain is not particularly limited, and examples thereof include a polyalkylene glycol. The polyalkylene glycol is not particularly limited, and includes, for example, polyethylene glycol, polypropylene glycol, polybutylene glycol, polypentylene glycol, polyhexylene glycol, polyheptylene glycol, polyoctylene glycol, polynonylene glycol, polydecylene glycol, etc. The water-soluble polymer having no alcoholic hydroxyl group in a side chain is preferably at least one selected from the group consisting of polyethylene glycol, polypropylene glycol, polybutylene glycol, polypentylene glycol, polyhexylene glycol, polyheptylene glycol, polyoctylene glycol, polynonylene glycol, polydecylene glycol. Among them, polypropylene glycol is particularly preferred.

Here, for example, polypropylene glycol is a generic term for a "polytrimethylene ether glycol", "polymethylethylene ether glycol", "polydimethylmethyl ether glycol", or the like. Similarly, the aforementioned polyalkylene glycols of the polybutylene glycol or below are generic names for a polyalkylene glycol having a linear structure and polyalkylene glycols having various branched structures.

By using these compounds, a polishing speed of a specific material (for example, the germanium-containing material, etc.) and a ratio of the polishing speeds between two or more different materials (for example, between the germanium-containing material and the silicon-containing compound other than the germanium-containing material, etc.) fall in more favorable ranges.

The weight-average molecular weight of the water-soluble polymer having no alcoholic hydroxyl group in a side chain is not particularly limited, and preferably 200 or higher and more preferably 300 or higher. These ranges result in a more favorable range of a ratio of polishing speeds between two or more different materials (for example, between the germanium-containing material and the silicon-containing compound other than the germanium-containing material, etc.). Moreover, the weight-average molecular weight of the water-soluble polymer having no alcoholic hydroxyl group in a side chain is not particularly limited, and is preferably 3,000 or lower, more preferably lower than 1,000, and still more preferably 800 or lower. The weight-average molecular weights within these ranges allow a polishing speed of a specific material (for example, the germanium-containing material, etc.) and a ratio of polishing speeds between two or more different materials (such as between the germanium-containing material and the silicon-containing compound other than the germanium-containing material, etc.) to fall in more favorable ranges.

The weight-average molecular weight of the water-soluble polymer having no alcoholic hydroxyl group in a side chain can be measured by gel permeation chromatography (GPC) using polyethylene oxide (manufactured by Sigma-Aldrich Co. LLC) as a standard material under the following conditions.

Apparatus: Model: HLC-8320GPC manufactured by Tosoh Corporation

Column: KF-802.5 (Shodex (registered trademark), Showa Denko K.K.)

Eluent: THF (tetrahydrofuran)

Flow rate: 1 mL/min

Detector: LS Laser Light Scattering Detector, and Shodex RI detector

Oven temperature: 30° C.

Injection volume: 100 μl

The water-soluble polymer having no alcoholic hydroxyl group in a side chains may be a commercially available product or a synthetic product.

One type of the water-soluble polymer having no alcoholic hydroxyl group in a side chain may be used alone, or two or more types thereof may be combined for use.

The concentration of the water-soluble polymer having no alcoholic hydroxyl group in a side chain in the polishing composition (mass (g) of the water-soluble polymer having no alcoholic hydroxyl group in a side chain in 1 L of the polishing composition) is not particularly limited, and is preferably 0.01 g/L or higher, more preferably 0.1 g/L or higher, still more preferably 0.5 g/L or higher, particularly preferably 1 g/L or higher, and most preferably 2 g/L or higher. The concentrations within these ranges further reduce a polishing speed of a specific material (for example, the germanium-containing material, etc.). Moreover, a ratio of polishing speeds between two or more different materials (for example, between the germanium-containing material and the silicon-containing compound other than the germanium-containing material, etc.) falls in a more favorable range. Further, the concentration of the water-soluble polymer having no alcoholic hydroxyl group in a side chain in the polishing composition (mass (g) of the water-soluble polymer having no alcoholic hydroxyl group in a side chain in 1 L of the polishing composition) is not particularly limited, and preferably 20 g/L or lower, more preferably 10 g/L or lower, still more preferably 5 g/L or lower, and particularly preferably 2.5 g/L or lower. The concentrations within these ranges allow a polishing speed of a specific material (for example, the germanium-containing material, etc.) and a ratio of polishing speeds between two or more different materials (for example, between the germanium-containing material and the silicon-containing compound other than the germanium-containing material, etc.) to fall in more favorable ranges.

[Water-Soluble Polymers having an Alcoholic Hydroxyl Group in a Side Chain]

The polishing composition according to one embodiment of the present invention may further contain a water-soluble polymer having an alcoholic hydroxyl group in a side chain. The water-soluble polymer having an alcoholic hydroxyl group in a side chain acts so as to reduce a polishing speed of a specific material. This action is expected to further improve a reduction effect on steps and dishing when polishing an object to be polished containing two or more different materials.

The water-soluble polymer having an alcoholic hydroxyl group in a side chain is not particularly limited as long as it has such a structure, and is preferably a compound including a structural moiety represented by the vinyl alcohol unit ($-CH_2-CH(OH)-$; hereinafter also referred to as "VA unit") in the structure, etc.

The compound including the VA unit in the structure may be a compound in which all the repeating units are substantially composed of VA units. Moreover, the compound including the VA unit in the structure may also be a compound further including, in addition to the VA unit, a non-vinyl alcohol unit (constituting unit derived from a monomer other than vinyl alcohol, hereinafter referred to as "non-VA unit"). The non-VA unit is not particularly limited, and includes, for example, constituting units derived from ethylene, vinyl acetate, vinyl propionate, vinyl hexanoate, 2-butenediol, and the like. A polymer including the constituting unit derived from vinyl alcohol may contain, when including the non-VA unit, one type of non-VA unit alone, or two or more types of non-VA units. In a compound including the VA unit in the structure, a proportion of the number of moles of VA units occupied in the total number of moles of repeating units is not particularly limited, and is preferably 50% or more, more preferably 65% or more, still more preferably 70% or more, and particularly preferably 75% or more (upper limit of 100%).

The water-soluble polymer having an alcoholic hydroxyl group in a side chain is preferably at least one type selected from the group consisting of, for example, polyvinyl alcohol, a polyvinyl alcohol derivative (polyvinyl alcohol derivative having an alcoholic hydroxyl group in a side chain), a copolymer of vinyl alcohol with other monomer (copolymer of vinyl alcohol with another monomer, wherein the copolymer has an alcoholic hydroxyl group in a side chain), and a derivative of the aforementioned copolymer (derivative of the copolymer of vinyl alcohol with another monomer, wherein the derivative has an alcoholic hydroxyl group in a side chain), etc.

The degree of saponification of polyvinyl alcohol is not particularly limited, and is preferably 50 mol % or more, more preferably 65 mol % or more, still more preferably 70 mol % or more, and particularly preferably 75 mol % or more (upper limit of 100%).

The polyvinyl alcohol derivative includes, for example, a modified polyvinyl alcohol, etc. The modified polyvinyl alcohol includes a structure in which a portion of the alcoholic hydroxyl groups of the vinyl alcohol units is replaced with other functional groups as the non-VA units (hereinafter also referred to as "modified VA unit").

The modified polyvinyl alcohol is not particularly limited, and includes, for example, a carboxy-modified polyvinyl alcohol, a sulfonic acid-modified polyvinyl alcohol, a phosphoric acid-modified polyvinyl alcohol, a silanol-modified polyvinyl alcohol, an epoxy-modified polyvinyl alcohol, an acetoacetyl-modified polyvinyl alcohol, a nitrile-modified polyvinyl alcohol, a pyrrolidone-modified polyvinyl alcohol, a silicone-modified polyvinyl alcohol, an amino-modified polyvinyl alcohol, a quaternary amino-modified polyvinyl alcohol, etc. Moreover, the modified polyvinyl alcohol is not particularly limited, and includes, for example, a compound obtained by cyclic acetalization of polyvinyl alcohol (for example, polyvinyl butyral, polyvinyl propyral, polyvinyl ethyral, polyvinyl methyral, etc.).

The derivatives of copolymers of vinyl alcohol with another monomer are not particularly limited, and include, for example, compounds further including, in addition to the VA units and the modified VA units, for example, ethylene-derived constituting units, constituting units derived from vinyl ether having a long alkyl chain, constituting units such as constituting units derived from a compound having at least one selected from the group consisting of acryloyl and methacryloyl groups, or the like.

The water-soluble polymer having an alcoholic hydroxyl group in a side chain preferably has no lactam structure and has an alcoholic hydroxyl group in a side chain.

In view of these, the water-soluble polymer having an alcoholic hydroxyl group in a side chain is more preferably polyvinyl alcohol, the modified polyvinyl alcohol, still more preferably polyvinyl alcohol, the sulfonic acid-modified polyvinyl alcohol, and particularly preferably polyvinyl alcohol.

By using these compounds, a polishing speed of a specific material (for example, the germanium-containing material, etc.) and a ratio of polishing speeds between two or more different materials (for example, between the germanium-containing material and the silicon-containing compound other than the germanium-containing material, etc.) fall in more favorably ranges.

The weight-average molecular weight of the water-soluble polymer having an alcoholic hydroxyl group in a side chain is not particularly limited, and is preferably 1,000 or higher, more preferably 3,000 or higher, and still more preferably 8,000 or higher. Moreover, the weight-average molecular weight of the water-soluble polymer having an alcoholic hydroxyl group in a side chain is not particularly limited, and is preferably 1,000,000 or lower, more preferably 100,000 or lower, and still more preferably 50,000 or lower. The weight-average molecular weights within these ranges allow a ratio of polishing speeds between two or more different materials (for example, between the germanium-containing material and the silicon-containing compound other than the germanium-containing material, etc.) to fall in a more favorable range.

The weight-average molecular weight of the water-soluble polymers having an alcoholic hydroxyl group in a side chain can be determined by gel permeation chromatography (GPC) using poly (vinyl alcohol) (manufactured by Sigma-Aldrich Co. LLC) as a standard material under the following conditions.

Apparatus: Model: HLC-8320GPC manufactured by Tosoh Corporation

Column: OHpak SB-806HQ +SB-803 HQ (Shodex (registered trademark), Showa Denko K.K.)

Eluent: 0.1 M NaCl solution

Flow rate: 1 mL/min

Detector: LS Laser Light Scattering Detector, and Shodex RI detector

Oven temperature: 40° C.

Injection volume: 100 µl

The water-soluble polymer having an alcoholic hydroxyl group in a side chain may be a commercially available product or synthetic product.

One type of water-soluble polymer having an alcoholic hydroxyl group in a side chain may be used alone, or two or more types thereof may be combined for use.

The concentration of the water-soluble polymer having an alcoholic hydroxyl group in a side chain in the polishing composition (mass (g) of the water-soluble polymer having an alcoholic hydroxyl group in a side chain in 1 L of the polishing composition) is not particularly limited, and is preferably 0.01 g/L or higher, more preferably 0.05 g/L or higher, still more preferably 0.1 g/L or higher, and particularly preferably 0.3 g/L or higher. These ranges result in a more favorable range of a ratio of polishing speeds between two or more different materials (for example, between the germanium-containing material and the silicon-containing compound other than the germanium-containing material, etc.). Moreover, the concentration of the water-soluble polymer having an alcoholic hydroxyl group in a side chain in the polishing composition (mass (g) of the water-soluble polymer having an alcoholic hydroxyl group in a side chain in 1 L of the polishing composition) is not particularly limited, and is preferably 10 g/L or lower, more preferably 5 g/L or lower, still more preferably 1 g/L or lower, and particularly preferably 0.8 g/L or lower. The concentrations within these ranges allow a polishing speed of a specific material (for example, the germanium-containing material, etc.) and a ratio of polishing speeds between two or more different materials (for example, between the germanium-containing material and the silicon-containing compound other than the germanium-containing material, etc.) to fall in more favorable ranges.

[Water-Soluble Polymer having a Lactam Structure]

The polishing composition according to one embodiment of the present invention may contain a water-soluble polymer having a lactam structure, but preferably contains no water-soluble polymer having a lactam structure substantially. Substantially containing no water-soluble polymer having a lactam structure further improves the effects of the present invention.

"Substantially containing no water-soluble polymer having a lactam structure" used herein indicates the concentration of the water-soluble polymer having a lactam structure in the polishing composition (mass of the water-soluble polymer having a lactam structure relative to the total mass of the polishing composition) being lower than 1 ppm by mass. The polishing composition according to one embodiment of the present invention particularly preferably contains no water-soluble polymer having a lactam structure, i.e., the concentration of the water-soluble polymer having a lactam structure in the polishing composition is 0 ppm by mass.

The "lactam structure" in the present description includes, for example, a β-lactam structure, a γ-lactam structure, a δ-lactam structure, an ε-caprolactam structure, and other lactam structures. The water-soluble polymer having a lactam structure includes, for example, a water-soluble polymer including a constituting unit derived from a monomer including a lactam structure. Incidentally, the "monomer including a lactam structure" used herein includes a monomer having a polymerizable group (for example, a vinyl group) on a nitrogen atom of the lactam.

The water-soluble polymer having a lactam structure is not particularly limited, and includes, for example, a homopolymer or copolymer of a monomer including a lactam structure, a copolymer of the monomer including a lactam structure with another monomer, and the like. The another monomer is not particularly limited, and includes, for example, vinyl alcohol, vinyl acetate, and the like. Types of copolymers are not particularly limited, and include, for example, a block copolymer, a random copolymer, a graft copolymer, and other types of copolymers.

One example of the water-soluble polymer having a lactam structure includes a homopolymer of the monomer including a lactam structure(polylactam). The polylactam is not particularly limited, and includes polyvinylpyrrolidone (PVP), polyvinylcaprolactam, polyvinylvalerolactam, polyvinyllaurolactam, polyvinylpiperidone, etc.

The lower limit of the weight-average molecular weight of the water-soluble polymer having a lactam structure is not particularly limited, and includes, for example, 1,000 or higher, 5,000 or higher, or 10,000 or higher, etc. The upper limit of the weight-average molecular weight of the water-soluble polymer having a lactam structure is not particularly limited, and includes 2,800,000 or lower, 1,200,000 or lower, 50,000 or lower, etc. It is noted that a method for measuring the weight-average molecular weight of the water-soluble polymer having a lactam structure is the same as that for the water-soluble polymer having no alcoholic hydroxyl group in a side chain described above, when the water-soluble polymer having a lactam structure has no alcoholic hydroxyl group in a side chain. Moreover, when the water-soluble polymer having a lactam structure has an alcoholic hydroxyl group in a side chain, the method is the same as that for the water-soluble polymer having an alcoholic hydroxyl group in a side chain described above.

When the polishing composition according to one embodiment of the present invention does not substantially contain the water-soluble polymer having a lactam structure, the water-soluble polymer having no alcoholic hydroxyl group in a side chain is preferably a water-soluble polymer having no lactam structure and having no alcoholic hydroxyl group in a side chain.

Moreover, when the polishing composition according to one embodiment of the present invention does not substantially contain the water-soluble polymer having a lactam structure, the water-soluble polymer having an alcoholic hydroxyl group in a side chain is preferably a water-soluble polymer having no lactam structure and having an alcoholic hydroxyl group in a side chain.

[Polyvalent Carboxylic Acid (Salt)]

The polishing composition according to one embodiment of the present invention contains a polyvalent carboxylic acid (salt). The polyvalent carboxylic acid (salt) acts to increase a polishing speed of a specific material.

The "polyvalent carboxylic acid (salt)" used herein denotes that the polyvalent carboxylic acid may be a polyvalent carboxylic acid itself or a salt of the polyvalent carboxylic acid. Then, "containing a polyvalent carboxylic acid (salt)" denotes that at least one selected from the group consisting of a polyvalent carboxylic acid and a salt of the polyvalent carboxylic acid (a polyvalent carboxylic acid, a salt of a polyvalent carboxylic acid, or both thereof) is contained.

The polyvalent carboxylic acid (salt) is not particularly limited, and include publicly known carboxylic acids and salts of the publicly known carboxylic acids. Among them, the polyvalent carboxylic acid (salt) is preferably dicarboxylic acid, a salt of dicarboxylic acid, tricarboxylic acid, a salt of tricarboxylic acid, and more preferably tricarboxylic acid and a salt of tricarboxylic acid.

Moreover, the polyvalent carboxylic acid (salt) preferably has a hydroxyl group in the molecule. The dicarboxylic acid that is the polyvalent carboxylic acid or constitutes a salt thereof is not particularly limited, and includes, for example, oxalic acid, malonic acid, succinic acid, adipic acid, pimelic acid, 2-pentene diacid, methylene succinic acid (itaconic acid), allyl malonic acid, isopropylidene-succinic acid, maleic acid, fumaric acid, citraconic acid, mesaconic acid, 2,4-hexadienedioic acid, acetylenedicarboxylic acid, glutaric acid, 2,5-frandicarboxylic acid, phthalic acid, isophthalic acid, terephthalic acid, malic acid, tartronic acid, tartaric acid, and the like. The tricarboxylic acid that is the polyvalent carboxylic acid or constitutes a salt thereof is not particularly limited, and includes, for example, 1,2,3-propanetricarboxylic acid, aconitic acid, 1,3,5-benzenetricarboxylic acid (trimethine acid), trimellitic acid, citric acid, isocitric acid, agaric acid, and the like. Tetravalent or higher polycarboxylic acid that is the polyvalent carboxylic acid or constitutes a salt thereof is not particularly limited, and includes, for example, 1,2,3,4-butanetetracarboxylic acid, pyromellitic acid, benzenepentacarboxylic acid, mellitic acid, and the like.

In view of these, the polyvalent carboxylic acid (salt) is preferably, for example, malic acid, a salt of malic acid, tartronic acid, a salt of tartronic acid, tartaric acid, a salt of tartaric acid, citric acid, a salt of citric acid, isocitric acid, a salt of isocitric acid, agaric acid, a salt of agaric acid, and more preferably citric acid, a salt of citric acid, isocitric acid, a salt of isocitric acid, agaric acid, a salt of agaric acid, and still more preferably citric acid, a salt of citric acid.

By using these polyvalent carboxylic acids (salts), a polishing speed of a specific material (for example, the germanium-containing material, etc.) and a ratio of polishing speeds between two or more different materials (for example, between the germanium-containing material and the silicon-containing compound other than the germanium-containing material, etc.), fall in more favorable ranges.

The polyvalent carboxylic acid (salt) is preferably a salt of the polyvalent carboxylic acid. In the salt of the polyvalent carboxylic acid, all carboxy groups of the polyvalent carboxylic acid may constitute salts, or a portion of carboxy groups of the polyvalent carboxylic acid alone may constitute salts, but the portion of carboxy groups of the polyvalent carboxylic acid alone preferably constitutes the salts.

A type of salts is not particularly limited, and includes publicly known types of salts. Examples thereof include a salt of an alkali metal, a salt of a Group 2 element, an ammonium salt, and the like. Among them, an ammonium salt is preferred.

By using these salts of polyvalent carboxylic acids, a polishing speed of a specific material (for example, the germanium-containing material, etc.) and a ratio of the polishing speeds between two or more different materials (such as between the germanium-containing material and the silicon-containing compound other than the germanium-containing material, etc.) fall in more favorable ranges.

In view of these, the polyvalent carboxylic acid (salt) is preferably an ammonium salt of dicarboxylic acid, an ammonium salt of a tricarboxylic acid, more preferably an ammonium salt of malic acid, an ammonium salt of tartronic acid, an ammonium salt of tartaric acid, an ammonium salt of citric acid, an ammonium salt of isocitric acid, an ammonium salt of agaric acid, still more preferably an ammonium salt of citric acid, an ammonium salt of isocitric acid, an ammonium salt of agaric acid, and particularly preferably an ammonium salt of citric acid. Moreover, the ammonium salt of citric acid is preferably diammonium hydrogen citrate, triammonium citrate, and ammonium dihydrogen citrate, and more preferably diammonium hydrogen citrate.

Incidentally, the polyvalent carboxylic acid (salt) may also function as a pH adjusting agent as described below.

The polyvalent carboxylic acid (salt) may be a commercially available product or synthetic product.

One type of polyvalent carboxylic acid (salt) may be used alone, or two or more types thereof are combined for use.

The concentration of the polyvalent carboxylic acid (salt) in the polishing composition (mass (g) of the polyvalent carboxylic acid (salt) in 1 L of the polishing composition) is not particularly limited, and is preferably 0.01 g/L or higher, more preferably 0.05 g/L or higher, still more preferably 0.1 g/L or higher, and particularly preferably 0.5 g/L or higher. The concentrations within these ranges allow a polishing speed of a specific material (for example, the germanium-containing material, etc.) to be enhanced more. Moreover, a ratio of polishing speeds between two or more different materials (for example, between the germanium-containing material and the silicon-containing compound other than the germanium-containing material, etc.) falls in a more favorable range. Further, the concentration of the polyvalent carboxylic acid (salt) in the polishing composition (mass (g) of the polyvalent carboxylic acid (salt) in 1 L of the polishing composition) is not particularly limited, and is preferably 10 g/L or lower, more preferably 5 g/L or lower, still more preferably 3 g/L or lower, and particularly preferably 1.5 g/L or lower. These ranges result in a more favorable range of a polishing speed of a specific material (for example, the germanium-containing material, etc.).

[Oxidizing Agent]

The polishing composition according to one embodiment of the present invention contains an oxidizing agent. The oxidizing agent acts to increase a polishing speed of a specific material.

The oxidizing agent is not particularly limited, and is preferably, for example, an oxidizing agent having a standard electrode potential of 0.3 V or more. By using such an oxidizing agent, a polishing speed of a specific material (for example, the germanium-containing material, etc.) and a ratio of polishing speeds between two or more different materials (for example, between the germanium-containing material and the silicon-containing compound other than the germanium-containing material, etc.) fall in more favorably ranges. An upper limit of the standard electrode potential described above is not particularly limited, and is preferably 3.0 V or less, 2.5 V or less, or 2.0 V or less, or the like. The oxidizing agent having a standard electrode potential of 0.3 V or more is not particularly limited, and includes, for example, hydrogen peroxide, sodium peroxide, barium peroxide, organic oxidants, ozone water, a silver (II) salt, an iron (III) salt, etc. Moreover, it includes, for example, permanganate acid, chromic acid, dichromic acid, peroxodisulfuric acid, peroxophosphoric acid, peroxosulfuric acid, perboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, sulfuric acid, persulfuric acid, dichloroisocyanuric acid, salts thereof, etc. Among them, hydrogen peroxide, ammonium persulfate, periodic acid, hypochlorous acid, sodium dichloroisocyanuric acid are preferred, and hydrogen peroxide is more preferred.

Incidentally, the standard electrode potential is an electrode potential when all chemical species associated with an oxidation reaction are in their standard state, and is represented by the following equation 1.

[Expression 1]

$$E^0 = -\Delta G^0/nF = (RT/nF)\ln K \qquad \text{Expression 1}$$

In Expression 1, $E^0$ is the standard electrode potential and $\Delta G^0$ is a standard Gibbs energy change of oxidation reaction, K is an equilibrium constant thereof (an equilibrium constant when an oxidizing agent undergoes an oxidation reaction), F is a Faraday constant (wherein the Faraday constant F is a product of an electric elementary quantity ($1.602 \times 10^{-19}$ [coulomb]) and an Avogadro constant $N_A$ ($6.022 \times 10^{23}$ [mol$^{-1}$]: 96485 [coulomb/mol]), R is a molar gas constant (wherein the molar gas constant R is a product of a Boltzmann constant k and the Avogadro constant $N_A$: 8.314 [J·K$^{-1}$·mol$^{-1}$]), T is the absolute temperature [K], and n is the number of electrons associated with the oxidation reaction. It is noted that In is a natural logarithm with Napier number e ($\approx 2.718$) as a base. As can be seen from Expression 1, the standard electrode potential varies with temperatures, so that the standard electrode potential at 25° C. is employed herein. For the standard electrode potential of aqueous solution systems, see, for example, the revised 4th edition of the Chemistry Handbook (Basic Edition) II, pp. 464-468 (edited by the Chemical Society of Japan).

The oxidizing agent may be a commercially available product or synthetic product.

One type of oxidizing agent may be used alone, or two or more types thereof may be used in combination.

The concentration of the oxidizing agent in the polishing composition (mass (g) of the oxidizing agent in 1 L of the polishing composition) is not particularly limited, and is preferably 0.1 g/L or higher, more preferably 1 g/L or higher, still more preferably 6 g/L or higher, and particularly preferably 10 g/L or higher. The concentrations within these ranges further improve a polishing speed of a specific material (for example, the germanium-containing material, etc.). Moreover, a ratio of polishing speeds between two or more different materials (for example, between the germanium-containing material and the silicon-containing compound other than the germanium-containing material, etc.) falls in a more favorable range. Further, the concentration of the oxidizing agent in the polishing composition (mass (g) of the oxidizing agent in 1 L of the polishing composition) is not particularly limited, and is preferably 100 g/L or lower, more preferably 50 g/L or lower, still more preferably 30 g/L or lower, and particularly preferably 20 g/L or lower. The concentrations within these ranges result in more favorable range of a polishing speed of a specific material (for example, the germanium-containing material, etc.) and that of a ratio of polishing speeds between two or more different materials (for example, between the germanium-containing material and the silicon-containing compound other than the germanium-containing material, etc.).

[pH Adjusting Agent]

The polishing composition according to one embodiment of the present invention may further contain a pH adjusting agent. The pH adjusting agent acts to adjust a pH value of the polishing composition to a desired value.

Incidentally, the pH adjusting agent used herein is defined as a compound other than the polyvalent carboxylic acid (salt) described above and denotes a compound that has a function of adjusting a pH of the polishing composition.

The pH adjusting agent is not particularly limited, and for example, publicly known acids or bases can be used.

The acid as the pH adjusting agent includes, for example, an inorganic acid, an organic acid, a chelating agent, etc. Examples of the inorganic acid as the pH adjusting agent are not particularly limited, and include hydrochloric acid (HCl), sulfuric acid ($H_2SO_4$), nitric acid ($HNO_3$), hydrofluoric acid (HF), boric acid ($H_3BO_3$), carbonic acid ($H_2CO_3$), hypophosphoric acid ($H_3PO_2$), phosphorous acid ($H_3PO_3$), phosphoric acid ($H_3PO_4$), etc. The organic acid as the pH adjusting agent is not particularly limited, and includes, for example, a monocarboxylic acid, an organic sulfuric acid, etc. Examples of the monocarboxylic acid are not particularly limited, and include formic acid, acetic acid, propionic acid, butyric acid, valeric acid, 2-methylbutyric acid, n-hexanoic acid, 3,3-dimethylbutyric acid 2-ethylbutyric acid, 4-methylpentanoic acid, n-heptanoic acid, 2-methylhexanoic acid, n-octanoic acid, 2-ethylhexanoic acid, benzoic acid, hydroxyacetic acid, salicylic acid, glyceric acid, lactic acid, glyoxylic acid, 2-furancarboxylic acid, 3-furancarboxylic acid, 2-tetrahydrofuran carboxylic acid, methoxyacetic acid, methoxyphenylacetic acid, phenoxyacetic acid, etc. Moreover, examples of organic sulfuric acid are not particularly limited, and include methanesulfonic acid, ethanesulfonic acid, isethionic acid, etc. The base as the pH adjusting agent includes, for example, a hydroxide of an alkali metal or a salt thereof, a hydroxide of a Group 2 element or a salt thereof, a quaternary ammonium hydroxide or a salt thereof, ammonia, amines, etc. Examples of the alkali metal includes potassium, sodium, etc. Examples of the Group 2 element includes magnesium, calcium, etc.

Among them, the inorganic acids are preferred, and are preferably hydrochloric acid, sulfuric acid, nitric acid, phosphoric acid, more preferably sulfuric acid, nitric acid, and still more preferably nitric acid. The use of such pH adjusting agents allows a polishing speed of a specific material (for example, the germanium-containing material, etc.) and a ratio of polishing speeds between two or more different materials (for example, between the germanium-containing material and the silicon-containing compound other than the germanium-containing material, etc.) to fall in more favorable ranges.

The pH adjusting agent may be a commercially available product or synthetic product.

One type of pH adjusting agent may be used alone, or two or more types thereof may be used in combination.

The concentration of the pH adjusting agent is not particularly limited, and is preferably a concentration such that a pH of the polishing composition is less than 6, and more preferably a concentration that falls within the pH range described below.

[pH]

The pH of the polishing composition according to one embodiment of the present invention is less than 6.

The lower limit of the pH of the polishing composition is not particularly limited, and is preferably 1 or more, more preferably 2 or more, and still more preferably 2.5 or more. These ranges allow a polishing speed of a specific material (for example, the germanium-containing material, etc.) to improve more, and allow a ratio of the polishing speeds between two or more different materials (for example, between the germanium-containing material and the silicon-containing compound other than the germanium-containing material, etc.) to fall in a more favorable range. Further, corrosion is more unlikely to occur, enabling application to an object to be polished containing a variety of materials. In addition, safety is improved more, further facilitating handleability. Moreover, the upper limit of the pH of the polishing composition is not particularly limited as long as it is less than 6, and is preferably 5 or less and more preferably 4 or less. These ranges allow a polishing speed of a specific material (for example, the germanium-containing material, etc.) and a ratio of polishing speeds between two or more different materials (for example, between the germanium-containing material and the silicon-containing compound other than the germanium-containing material, etc.) to fall in more favorable ranges. It is noted that the pH of the polishing composition can be measured with a pH meter (LAQUA (registered trademark) manufactured by Horiba, Ltd.).

[Dispersing Medium]

The polishing composition according to one embodiment of the present invention may further contain a dispersing medium. The dispersing medium acts so as to disperse or dissolve each component in the polishing composition.

The content of water in the dispersing medium is not particularly limited, and is preferably 50% by mass or more with respect to the total mass of the dispersing medium, more preferably 90% by mass or more, and still more preferably water alone. Water is preferably water that contains as few impurities as possible from the viewpoint of preventing contamination of an object to be polished and hindering actions of other components. For example, water containing transition metal ions in a total content of 100 ppb by mass or less is preferred. Here, the purity of the water can be enhanced, for example, by removing impurity ions using an ion exchange resin, removing foreign substances by filtering, distillation, or other operations. Specifically, as the water, deionized water (ion-exchanged water), pure water, ultrapure water, distilled water or the like, can be used.

The dispersing medium may further contain an organic solvent. The organic solvent is not particularly limited, and publicly known organic solvents can be used.

One type of organic solvent may be used alone, or two or more types thereof may be combined for use.

[Other Components]

The polishing composition according to one embodiment of the present invention may further contain other components excluding each of the aforementioned components. The other components include, for example, components used in publicly known polishing compositions. The other components include, for example, amino acid, a chelating agent, a metal anticorrosive, an antiseptic agent, an antifungal agent, etc.

[Method for Producing Polishing Composition]

The method for producing the polishing composition according to one embodiment of the present invention is not particularly limited as long as it is a method comprising mixing the abrasive grains, the water-soluble polymer having no alcoholic hydroxyl group in a side chain, the polyvalent carboxylic acid (salt), and the oxidizing agent, wherein the pH of the polishing composition to be produced is less than 6. In this case, the water-soluble polymer having an alcoholic hydroxyl group in a side chain, the pH adjusting agent, the dispersing medium, and other components may be further mixed as needed. A mixing method upon mixing the respective components is not particularly limited, and publicly known methods may be appropriately employed. Moreover, the mixing temperature is not particularly limited, and is generally 10° C. or higher and 40° C. or lower, and heating may be carried out to increase a rate of dissolution. In addition, a mixing time is also not particularly limited.

[Object to be Polished]

The object to be polished to which the polishing composition according to one embodiment of the present invention is applied is not particularly limited, and includes, for example, publicly known objects to be polished used in the field of CMP.

The object to be polished is not particular limited, and is preferably, for example, a member having a flat surface, more preferably a substrate, and still more preferably a semiconductor substrate. The substrate is not particularly limited, and includes, for example, a substrate composed of a single layer, a substrate having a structure with two or more layers laminated on top of each other, and a substrate having a structure with two or more substances lined up on the surface. Among them, the substrate is preferably a substrate having a structure with two or more types of substances lined up on the surface, and more preferably a substrate having a structure with two or three types of substances lined up on the surface, and still more preferably a substrate having a structure with two types of substances alternately lined up on the surface.

A material constituting the object to be polished, applied to the polishing composition according to one embodiment of the present invention, are not particularly limited. However, the object to be polished applied to the composition according to one embodiment of the present invention preferably contains a material containing at least one selected from the group consisting of silicon and germanium, more preferably a germanium-containing material, still more preferably a germanium-containing material represented by $Si_X Ge_{(1-X)}$ where $0 \le X < 1$, even still more preferably silicon germanium (a material represented by $Si_Y Ge_{(1-Y)}$ where $0 < Y < 1$), and particularly preferably a material represented by $Si_Z Ge_{(1-Z)}$ where $0.01 \le Z < 1$. Here, Z is preferably 0.05 or more and 0.95 or less and more preferably 0.1 or more and 0.90 or less. Applying the polishing composition according to one embodiment of the present invention to objects to be polished containing these materials, allows a polishing speed of a specific material to fall in a more favorable range.

Moreover, the object to be polished applied to the polishing composition according to one embodiment of the present invention, preferably contains two or more materials. The object to be polished containing two or more materials is not particularly limited, and is preferably an object to be polished containing the germanium-containing material and the silicon-containing compound other than the germanium-containing material. Namely, the polishing composition according to one embodiment of the present invention is preferably used for polishing the object to be polished containing the germanium-containing material and the silicon-containing compound other than the germanium-containing material. Here, the silicon-containing compound other than the germanium-containing material is not particularly limited, and includes, for example, a material having a silicon-oxygen bond, a material having a silicon-silicon bond, a material having a silicon-nitrogen bond, etc. Moreover, the material having a silicon-oxygen bond is not particularly limited, and includes, for example, silicon oxide, BD (black diamond: SiOCH), FSG (fluorosilicate glass), HSQ (hydrogen silsesquioxane), CYCLOTENE, SiLK, MSQ (Methyl silsesquioxane, etc. Further, the material having a silicon-silicon bond is not particularly limited, and includes, for example, polycrystalline silicon (polysilicon, poly-Si), amorphous silicon, single-crystal silicon, n-type doped single-crystal silicon, p-type doped single-crystal silicon, etc. Furthermore, the material having a silicon-nitrogen bond is not particularly limited, and includes, for example, silicon nitride (SiN), silicon carbonitride (SiCN), etc. Among them, the silicon-containing compound other than the germanium-containing material is preferably the material having a silicon-oxygen bond and the material having a silicon-silicon bond and more preferably silicon oxide and polysilicon.

Applying the polishing composition according to one embodiment of the present invention to the object to be polished containing two or more of these materials allows a polishing speed of a specific material to fall in a more favorable range. Moreover, a ratio of polishing speeds between two or more different materials fall in a more favorable range.

Therefore, the object to be polished applied to the polishing composition according to one embodiment of the present invention preferably contains the germanium-containing material, and at least one selected from the group consisting of the material having a silicon-oxygen bond and the material having a silicon-silicon bond (the material having a silicon-oxygen bond, the material having a silicon-silicon bond, or both thereof), more preferably contains silicon germanium, and at least one selected from the group consisting of silicon oxide and polysilicon (silicon oxide, polysilicon, or both thereof), and still more preferably silicon germanium, silicon oxide, and polysilicon.

Moreover, the object to be polished applied to the polishing composition according to one embodiment of the present invention may also contain other materials excluding the aforementioned materials. The other materials are not particularly limited, and include, for example, metals such as copper, aluminum, hafnium, cobalt, nickel, titanium, tungsten, alloys thereof, etc. Further, for example, a metal oxide such as alumina, etc., are included. Furthermore, for example, a metal nitride such as titanium nitride and tantalum nitride, etc., are included.

Incidentally, the material containing at least one selected from the group consisting of silicon and germanium, the germanium-containing material, the silicon-containing compound other than the germanium-containing material, and the other materials may each be used alone, or two or more types thereof may be combined for use.

[Polishing Method and Method for Producing Polished Substrate]

Another aspect of the present invention relates to a method for polishing an object to be polished using the polishing composition described above. Details of the polishing composition to be used and the object to be polished applied in the polishing method according to one embodiment of the present invention are as described above, respectively. From these, in the polishing method according to one embodiment of the present invention, one example of the preferred object to be polished includes an object to be polished containing the germanium-containing material and the silicon-containing compound other than the germanium-containing material.

In the polishing method according to one embodiment of the present invention, the details of the polishing technique, polishing conditions, and pieces of polishing apparatus, etc., are not particularly limited, and publicly known techniques, conditions, and pieces of apparatus, etc., can be employed.

As the polishing apparatus used in the polishing step, a polishing apparatus used in general chemical mechanical polishing processes can be used. Such a polishing apparatus is equipped with a carrier that holds the object to be polished and a motor that can change the rotation speed, etc., as well as a platen to which a polishing pad (or polishing cloth) can be attached.

The polishing pad is not particularly limited, and for example, a general non-woven fabric, a polyurethane resin pad (a pad made of polyurethane), a porous fluororesin pad and the like, can be used. Furthermore, the polishing pad can be subjected to grooving as necessary, allowing the polishing composition to accumulate in the grooves of the polishing pad.

Parameter conditions of the polishing step are not particularly limited as well, and can be adjusted in accordance with actual need. The rotational speed of the platen is not particularly limited, and is, for example, 10 to 500 rpm (0.2 to 8.3 $s^{-1}$ where 60 rpm=1 $s^{-1}$. The same applies hereinafter.), and the rotational speed of the carrier is not particularly limited, and can be, for example, 10 to 500 rpm (0.2 to 8.3 $s^{-1}$). Moreover, the pressure applied to the object to be polished (polishing pressure) is not particularly limited, and can be, for example, 0.1 to 10 psi (0.7 to 68.9 kPa where 1 psi=6894.76 Pa. The same applies hereinafter.), and preferably 2 to 3 psi (13.8 to 20.7 kPa). The polishing time is not particularly limited, and can be, for example, 10 to 180 seconds, preferably 20 to 150 seconds, and more preferably 30 to 120 seconds. The flow rate of the polishing composition is not particularly limited, and can be, for example, 10 to 500 ml/min. The method for supplying the polishing composition to the polishing pad is also not particularly limited as well, and can employ, for example, a continuous supply method using a pump, etc.

Following the polishing step, the object to be polished may be washed in a stream of water and dried by blowing off water droplets adhering to the object to be polished with a rotary dryer or similar apparatus.

Other aspect of the present invention relates to a method for producing a polished substrate, comprising polishing a substrate using the polishing composition described above, or polishing a substrate by the polishing method described above wherein the object to be polished is the substrate. In the method for producing a polished substrate according to one embodiment of the present invention, the details of the polishing composition to be used, the object to be polished to be applied, and the polishing method to be employed, respectively, are as described above. In the method for producing a polished substrate according to one embodiment of the present invention, an example of a preferred substrate includes a substrate containing the germanium-containing material and the silicon-containing compound other than the germanium-containing material.

The embodiments of the present invention have been described in detail; however, it is clear that they are illustrative and exemplary, not limiting, and that the scope of the present invention should be interpreted by the claims appended.

The present invention encompasses the following aspects and embodiments.

[1] A polishing composition comprising: abrasive grains; a water-soluble polymer having no alcoholic hydroxyl group in a side chain; a polyvalent carboxylic acid (salt); and an oxidizing agent, and having a pH of less than 6.

[2] The polishing composition according to the above [1], further comprising a water-soluble polymer having an alcoholic hydroxyl group in a side chain.

[3] The polishing composition according to the above [2], wherein the water-soluble polymer having an alcoholic hydroxyl group in a side chain is at least one selected from the group consisting of polyvinyl alcohol, a polyvinyl alcohol derivative, a copolymer of vinyl alcohol with other monomers, and a derivative of the copolymer.

[4] The polishing composition according to any one of the above [1] to [3], wherein the polyvalent carboxylic acid (salt) has an intramolecular hydroxyl group.

[5] The polishing composition according to any one of the above [1] to [4], wherein the water-soluble polymer having no alcoholic hydroxyl group in a side chain comprises in the structure a polyalkylene oxide group represented by formula (I) below:

[Formula 2]

$$+C_xH_{2x}O+_n \tag{I}$$

wherein in formula (I) above, X is an integer of 2 or more and n is an integer of 2 or more.

[6] The polishing composition according to any one of the above [1] to [5], wherein the water-soluble polymer having no alcoholic hydroxyl group in a side chain is at least one selected from the group consisting of polyethylene glycol, polypropylene glycol, polybutylene glycol, polypentylene glycol, polyhexylene glycol, polyheptylene glycol, polyoctylene glycol, polynonylene glycol, and polydecylene glycol.

[7] The polishing composition according to any one of the above [1] to [6], wherein a weight-average molecular weight of the water-soluble polymer having no alcoholic hydroxyl group in a side chain is lower than 1,000.

[8] The polishing composition according to any one of the above [1] to [7], wherein the abrasive grains are abrasive grains with organic acid functional groups covalently bonded on the surface.

[9] The polishing composition according to any one of the above [1] to [8], being used for polishing an object to be polished comprising a germanium-containing material and a silicon-containing compound other than the germanium-containing material.

[10] A method for polishing an object to be polished using the polishing composition according to any one of the above [1] to [9].

[11] The polishing method according to the above [10], wherein the object to be polished comprises a germanium-containing material and a silicon-containing compound other than the germanium-containing material.

[12] A method for producing a polished substrate, comprising polishing a substrate using the polishing composition according to any one of the above [1] to [8], or polishing the substrate by the polishing method according to the above [10] or [11] wherein the object to be polished is a substrate.

[13] The method for producing a polished substrate according to the above [12], wherein the substrate comprises a germanium-containing material and a silicon-containing compound other than the germanium-containing material.

EXAMPLES

The present invention will be described in more detail with reference to the following Examples and Comparative Examples. However, the technological scope of the present invention is not limited only to the following Examples. Incidentally, "%" and "part" refer to "% by mass" and "part by mass," respectively, unless otherwise specified.
<Preparation of Polishing Composition>

According to the compositions shown in Tables 1 and 2 below each, the components to be used among the abrasive grains, the water-soluble polymer having no alcoholic hydroxyl group in a side chain, the water-soluble polymer having an alcoholic hydroxyl group in a side chain, the polyvalent carboxylic acid (salt) or a comparative component thereof, the oxidizing agent, and the pH adjusting agent were mixed in ultrapure water that was a dispersing medium (mixing temperature: about 25° C., mixing time: about 10 minutes) to prepare the polishing composition according to Examples and Comparative Examples. It is noted that the concentration of the pH adjusting agent was set to a concentration such that the pH values became those shown in Tables 1 and 2 below. The pH values of the polishing compositions were confirmed using a pH meter (LAQUA (registered trademark) manufactured by Horiba, Ltd.) (the temperature of the polishing composition upon measurement of the pH value was 25° C.). Moreover, "-" in Tables 1 and 2 below indicates that the component is not added. The details of each component in Tables 1 and 2 below are as follows.

[Abrasive Grains]
Colloidal silica with sulfonic acid groups immobilized on the surface (colloidal silica with sulfonic acid immobilized on the surface): (primary average particle size: 35 nm, secondary average particle size (70 nm, cocoon shape).

22

[Water-Soluble Polymer Having no Alcoholic Hydroxyl Group in a Side Chain]
PPG400: Polypropylene glycol (weight-average molecular weight of 400);
PPG700: Polypropylene glycol (weight-average molecular weight of 700); and
TPG: Tripropylene glycol (polypropylene glycol with 3 repeating units, weight-average molecular weight of 192); where the molecules of PPG400, PPG 700 and TPG, respectively, have a structure of OH—[—CH_2CH(CH_3)O—]_n—H (n is the number of repeating units).
[Water-Soluble Polymer Having an Alcoholic Hydroxyl Group in a Side Chain]
PVA4000: Polyvinyl alcohol (weight-average molecular weight of 4,000);
PVA10000: Polyvinyl alcohol (weight-average molecular weight of 10,000);
PVA22000: Polyvinyl alcohol (weight-average molecular weight of 22,000); and
S-PVA: Sulfonic-acid modified polyvinyl alcohol (weight-average molecular weight of 10,000).
[Polyvalent Carboxylic Acid (Salt) or its Comparative Component]
Citric acid $H(NH_4)_2$: Diammonium hydrogen citrate (salt of a polyvalent carboxylic acid having a hydroxyl group in the molecule)
Maleic acid: (polyvalent carboxylic acid)
Ammonium acetate: (a salt of a monocarboxylic acid).
[Oxidizing Agent]
Hydrogen peroxide: (31% by mass concentration of hydrogen peroxide water; the values in Tables 1 and 2 below are those in terms of hydrogen peroxide content).
[pH Adjusting Agent]
Nitric acid: (70% by mass concentration of nitric acid aqueous solution; the values in Tables 1 and 2 below are those in terms of nitric acid content).
Sulfuric acid: (62.5% by mass concentration of sulfuric acid aqueous solution; the values in Tables 1 and 2 below are those in terms of sulfuric acid content).
Acetic acid: (about 100% by mass concentration of solution).

TABLE 1

| | Abrasive grains (colloidal silica with sulfonic acid immobilized on the surface) | Water-soluble polymer having an alcoholic hydroxyl group in the side chain | | Water-soluble polymer having no alcoholic hydroxyl group in the side chain | | Multivalent carboxylic acid (salt) or its comparative component | | Oxidizing agent (hydrogen peroxide) | pH | |
|---|---|---|---|---|---|---|---|---|---|---|
| Polishing composition | Concentration [% by mass] | Types | Concentration [g/L] | Types | Concentration [g/L] | Types | Concentration [g/L] | Concentration [g/L] | adjusting agent Types | pH |
| Example 1 | 1 | PVA10000 | 0.5 | PPG400 | 2.25 | Citric acid $H(NH_4)_2$ | 1.0 | 12.4 | Nitric acid | 2.5 |
| Example 2 | 1 | PVA10000 | 0.5 | PPG400 | 2.25 | Citric acid $H(NH_4)_2$ | 1.0 | 12.4 | Nitric acid | 3.0 |
| Example 3 | 1 | PVA10000 | 0.5 | PPG400 | 2.25 | Citric acid $H(NH_4)_2$ | 1.0 | 12.4 | Nitric acid | 4.0 |
| Example 4 | 1 | PVA10000 | 0.5 | PPG400 | 2.25 | Citric acid $H(NH_4)_2$ | 1.0 | 12.4 | Nitric acid | 5.0 |
| Comparative Example 1 | 0 | PVA10000 | 0.5 | PPG400 | 2.25 | Citric acid $H(NH_4)_2$ | 1.0 | 12.4 | Nitric acid | 3.0 |
| Example 5 | 0.5 | PVA10000 | 0.5 | PPG400 | 2.25 | Citric acid $H(NH_4)_2$ | 1.0 | 12.4 | Nitric acid | 3.0 |
| Example 6 | 2 | PVA10000 | 0.5 | PPG400 | 2.25 | Citric acid $H(NH_4)_2$ | 1.0 | 12.4 | Nitric acid | 3.0 |
| Example 7 | 1 | — | 0 | PPG400 | 2.25 | Citric acid $H(NH_4)_2$ | 1.0 | 12.4 | Nitric acid | 3.0 |
| Example 8 | 1 | PVA10000 | 0.1 | PPG400 | 2.25 | Citric acid $H(NH_4)_2$ | 1.0 | 12.4 | Nitric acid | 3.0 |
| Example 9 | 1 | PVA10000 | 1.0 | PPG400 | 2.25 | Citric acid $H(NH_4)_2$ | 1.0 | 12.4 | Nitric acid | 3.0 |
| Comparative Example 2 | 1 | PVA10000 | 0.5 | — | 0 | Citric acid $H(NH_4)_2$ | 1.0 | 12.4 | Nitric acid | 3.0 |
| Example 10 | 1 | PVA10000 | 0.5 | PPG400 | 1.00 | Citric acid $H(NH_4)_2$ | 1.0 | 12.4 | Nitric acid | 3.0 |
| Example 11 | 1 | PVA10000 | 0.5 | PPG400 | 3.00 | Citric acid $H(NH_4)_2$ | 1.0 | 12.4 | Nitric acid | 3.0 |
| Comparative | 1 | PVA10000 | 0.5 | PPG400 | 2.25 | — | | 0 | 12.4 | Nitric acid | 3.0 |

TABLE 1-continued

Composition of polishing composition

| Polishing composition | Abrasive grains (colloidal silica with sulfonic acid immobilized on the surface) Concentration [% by mass] | Water-soluble polymer having an alcoholic hydroxyl group in the side chain Types | Concentration [g/L] | Water-soluble polymer having no alcoholic hydroxyl group in the side chain Types | Concentration [g/L] | Multivalent carboxylic acid (salt) or its comparative component Types | Concentration [g/L] | Oxidizing agent (hydrogen peroxide) Concentration [g/L] | pH adjusting agent Types | pH |
|---|---|---|---|---|---|---|---|---|---|---|
| Example 3 | | | | | | | | | | |
| Example 12 | 1 | PVA10000 | 0.5 | PPG400 | 2.25 | Citric acid $H(NH_4)_2$ | 0.5 | 12.4 | Nitric acid | 2.7 |
| Comparative Example 4 | 1 | PVA10000 | 0.5 | PPG400 | 2.25 | Citric acid $H(NH_4)_2$ | 1.0 | 0 | Nitric acid | 3.0 |
| Example 13 | 1 | PVA10000 | 0.5 | PPG400 | 2.25 | Citric acid $H(NH_4)_2$ | 1.0 | 15.0 | Nitric acid | 3.0 |
| Comparative Example 5 | 1 | PVA10000 | 0.5 | PPG400 | 2.25 | Ammonium acetate | 1.0 | 12.4 | Nitric acid | 3.0 |

TABLE 2

Composition of polishing composition

| Polishing composition | Abrasive grains (colloidal silica with sulfonic acid immobilized on the surface) Concentration [% by mass] | Water-soluble polymer having an alcoholic hydroxyl group in the side chain Types | Concentration [g/L] | Water-soluble polymer having no alcoholic hydroxyl group in the side chain Types | Concentration [g/L] | Multivalent carboxylic acid (salt) or its comparative component Types | Concentration [g/L] | Oxidizing agent (hydrogen peroxide) Concentration [g/L] | pH adjusting agent Types | pH |
|---|---|---|---|---|---|---|---|---|---|---|
| Example 14 | 1 | PVA10000 | 0.5 | PPG400 | 2.25 | Citric acid $H(NH_4)_2$ | 1.0 | 12.4 | Sulfuric acid | 3.0 |
| Example 15 | 1 | PVA10000 | 0.5 | PPG400 | 2.25 | Citric acid $H(NH_4)_2$/ maleic acid | 1.0/ 0.5 | 12.4 | — | 3.0 |
| Example 16 | 1 | PVA10000 | 0.5 | PPG400 | 2.25 | Citric acid $H(NH_4)_2$ | 1.0 | 12.4 | Acetic acid | 3.0 |
| Example 17 | 1 | PVA4000 | 0.5 | PPG400 | 2.25 | Citric acid $H(NH_4)_2$ | 1.0 | 12.4 | Nitric acid | 3.0 |
| Example 18 | 1 | PVA22000 | 0.5 | PPG400 | 2.25 | Citric acid $H(NH_4)_2$ | 1.0 | 12.4 | Nitric acid | 3.0 |
| Example 19 | 1 | PVA10000 | 0.5 | TPG | 2.25 | Citric acid $H(NH_4)_2$ | 1.0 | 12.4 | Nitric acid | 3.0 |
| Example 20 | 1 | PVA10000 | 0.5 | PPG700 | 2.25 | Citric acid $H(NH_4)_2$ | 1.0 | 12.4 | Nitric acid | 3.0 |
| Example 21 | 1 | S-PVA | 0.5 | PPG400 | 2.25 | Citric acid $H(NH_4)_2$ | 1.0 | 12.4 | Nitric acid | 3.0 |

<Evaluation>

[Measurement of Polishing Speed]

The polishing compositions obtained above were used to polish a silicon germanium (SiGe) substrate (specifically $Si_{0.75}Ge_{0.25}$, manufactured by Silicon Valley Microelectronic, Inc.), polysilicon (poly-Si) substrate (manufactured by Advanced Materials Technology, Inc.), and silicon oxide ($SiO_2$) substrate (manufactured by Advanced Materials Technology, Inc.), respectively, under the polishing conditions below, and each of the polishing speeds upon the polishing was measured.

Polishing apparatus: FREX 300E manufactured by Ebara Corporation
Polishing pad: Polyurethane pad
Polishing pressure: 1.0 psi (6.9 kPa)
Platen rotation speed: 90 rpm (1.5 s$^{-1}$)
Head rotation speed: 90 rpm (1.5 s$^{-1}$)
Supply of polishing composition: Pouring Polishing composition feed rate: 300 mL/min
Polishing time: 60 sec.

Thicknesses of the object to be polished before and after polishing were measured using an optical interferometry thickness measurement system (Filmetrics F20 manufactured by Filmetrics, Inc.). The polishing speed was calculated by the following formula. These results are shown in Table 3 below.

$$\text{Polishing speed} = \{[\text{Thickness before polishing}] - [\text{Thickness after polishing}]\}/[\text{Processing time}] \quad \text{[Expression 2]}$$

In the above expression, the unit of thickness is "Å" (10 Å=1 nm, the same applies hereinafter.), the unit of processing time is "minute", and the unit of the polishing speed is "Å/min". It is noted that the processing time specifically refers to a polishing time.

Incidentally, in this evaluation, the polishing speed of the SiGe substrate of 30 Å/min (3.0 nm/min) or faster and 70 Å/min (7.0 nm/min) or slower were determined to obtain an excellent effect.

This is because, in this evaluation, the polishing speed of the SiGe substrate of 30 Å/min or faster allows the favorable polishing effect due to the high polishing efficiency of SiGe to be obtained, while the polishing speed of the SiGe substrate of slower than 30 Å/min results in lower polishing efficiency, not enabling the sufficient polishing effect to be obtained. Moreover, this is because, in this evaluation, the polishing speed of the SiGe substrate of 70 Å/min or slower makes the balance between the polishing speed of SiGe and the polishing speeds of the materials other than SiGe (in this experiment, poly-Si and $SiO_2$) excellent, and can expect an excellent reduction effect on steps and dishing, while the polishing speed of the SiGe substrate of faster than 70 Å/min excessively enhances the polishing speed of SiGe alone and breaks the balance between the polishing speed of SiGe and the polishing speeds of the materials other than SiGe (in this experiment, the poly-Si and $SiO_2$), and thereby cannot expect the satisfactory reduction effect on steps and dishing.

Among the aforementioned ranges, from the viewpoint of the polishing efficiency and reduction effects on steps and dishing, the polishing speed of the SiGe substrate in this evaluation of 35 Å/min (3.5 nm/min) or faster and 65 Å/min (6.5 nm/min) or slower were determined to obtain an excellent effect, and the value of 40 Å/min (4.0 nm/min) or faster and 60 Å/min (6.0 nm/min) or slower were determined to obtain a particularly excellent effect.

[Calculation of Selective Ratio of Polishing Speed]

The polishing speed of the SiGe substrate, the polishing speed of the poly-Si substrate, and the polishing speed of the $SiO_2$ substrate, all obtained above, were used to calculate a ratio of the polishing speed of the SiGe substrate to the polishing speed of the poly-Si substrate (selective ratio of SiGe/poly-Si), and a ratio of the polishing speed of the SiGe substrate to the polishing speed of the $SiO_2$ substrate (selective ratio of SiGe/$SiO_2$). These results are shown in Table 3 below.

Incidentally, in this evaluation, the selective ratio of SiGe/poly-Si and the selective ratio of SiGe/$SiO_2$ that were 1.0 or more and 3.0 or less, respectively, were determined to obtain an excellent effect.

The reason for this is conjectured because, in this evaluation, the selective ratio of SiGe/poly-Si and the selective ratio of SiGe/$SiO_2$ being 1.0 or more, respectively, are satisfactory in the polishing effect on SiGe, and are expected to construct desired steps, while the selective ratio of SiGe/poly-Si and the selective ratio of SiGe/$SiO_2$ being less than 1.0, respectively, are unsatisfactory in the polishing effect on SiGe, rendering difficult to construct the desired steps. Moreover, the reason is also conjectured because in this evaluation, the selective ratio of SiGe/poly-Si and the selective ratio of SiGe/$SiO_2$ being 3.0 or less, respectively, results in the small amount of SiGe loss and is expected to construct the desired steps, while the selective ratio of SiGe/poly-Si and the selective ratio of SiGe/$SiO_2$ exceeding 3.0, respectively, excessively enhances the polishing speed of SiGe alone, results in the large amount of SiGe loss, rendering difficult to construct the desired steps.

Among the above ranges, from the viewpoint of construction of desired steps and the amount of SiGe loss, the selective ratio of SiGe/poly-Si and the selective ratio of SiGe/$SiO_2$ in this evaluation, respectively, being 1.2 or more and 2.0 or less were determined to obtain a more excellent effect, and each value of 1.4 or more and 1.7 or less was determined to obtain a particularly excellent effect.

Incidentally, in this evaluation, the selective ratio of SiGe/poly-Si and the selective ratio of SiGe/$SiO_2$ of 1.0 or more, respectively, were confirmed to obtain the effect of improving removability of SiGe residue after polishing as well, in addition to the aforementioned effects. Further, in this evaluation, the selective ratio of SiGe/poly-Si and selective ratio of SiGe/$SiO_2$ being 1.2 or more, respectively, further improves the removability of SiGe residue after the polishing, and each of these values being 1.4 or more further improves the removability of SiGe residue after the polishing.

Incidentally, in this evaluation, both of the selective ratio of SiGe/poly-Si and the selective ratio of SiGe/$SiO_2$, particularly preferably fall within the above ranges.

TABLE 3

| Polishing speed and selective ratio by polishing composition | | | | | |
|---|---|---|---|---|---|
| | Polishing speed | | | Selective ratio | |
| Polishing composition | SiGe [Å/min] | poly-Si [Å/min] | $SiO_2$ [Å/min] | SiGe/ poly-Si | SiGe/ $SiO_2$ |
| Example 1 | 37.0 | 22.0 | 25.0 | 1.68 | 1.48 |
| Example 2 | 52.0 | 33.0 | 30.0 | 1.58 | 1.73 |
| Example 3 | 53.6 | 45.9 | 28.5 | 1.17 | 1.88 |
| Example 4 | 57.8 | 53.6 | 26.8 | 1.08 | 2.15 |
| Comparative Example 1 | 4.1 | 5.0 | 0.7 | 0.82 | 5.86 |
| Example 5 | 43.8 | 26.7 | 20.2 | 1.64 | 2.17 |
| Example 6 | 68.3 | 60.9 | 49.9 | 1.12 | 1.37 |
| Example 7 | 64.6 | 30.3 | 30.2 | 2.13 | 2.14 |
| Example 8 | 62.1 | 31.9 | 30.2 | 1.95 | 2.06 |
| Example 9 | 39.4 | 32.1 | 30.1 | 1.23 | 1.31 |
| Comparative Example 2 | 120.7 | 81.7 | 33.9 | 1.48 | 3.56 |
| Example 10 | 69.2 | 62.3 | 32.2 | 1.11 | 2.15 |
| Example 11 | 32.1 | 23.6 | 28.9 | 1.36 | 1.11 |
| Comparative Example 3 | 7.3 | 8.2 | 24.4 | 0.90 | 0.30 |
| Example 12 | 30.7 | 23.1 | 27.3 | 1.32 | 1.12 |
| Comparative Example 4 | 0 | 29.1 | 31.5 | 0 | 0 |
| Example 13 | 63.2 | 45.8 | 29.8 | 1.38 | 2.12 |
| Comparative Example 5 | 17.0 | 29.7 | 31.1 | 0.57 | 0.55 |
| Example 14 | 47.0 | 31.2 | 29.9 | 1.51 | 1.57 |
| Example 15 | 41.1 | 38.2 | 33.5 | 1.08 | 1.23 |
| Example 16 | 39.4 | 36.7 | 32.6 | 1.07 | 1.21 |
| Example 17 | 59.2 | 37.1 | 31.4 | 1.60 | 1.89 |
| Example 18 | 46.1 | 23.2 | 29.9 | 1.99 | 1.54 |
| Example 19 | 44.0 | 41.0 | 29.9 | 1.07 | 1.47 |
| Example 20 | 32.8 | 25.6 | 21.0 | 1.28 | 1.56 |
| Example 21 | 51.8 | 32.1 | 29.9 | 1.61 | 1.73 |

As described in Tables 1 to 3 above, each of the polishing compositions according to Examples 1 to 21, contains the abrasive grains, the water-soluble polymer having no alcoholic hydroxyl group in a side chain, the polyvalent carboxylic acid (salt), and the oxidizing agent, wherein the pH of the polishing composition is less than 6. From the above Tables 1 to 3, it was confirmed that the polishing compositions according to Examples 1 to 21 realize the moderately high SiGe polishing speeds, as well as the favorable ranges of the selective ratio of SiGe/poly-Si and the selective ratio of SiGe/$SiO_2$. From these results, the polishing compositions according to Examples 1 to 21 are expected to exhibit the polishing effect with high efficiency on the object to be polished containing SiGe, and the excellent reduction effect on steps and dishing on the object to be polished containing SiGe and poly-Si, in the object to be polished containing the SiGe and $SiO_2$.

On the other hand, in the polishing composition according to Comparative Example 1 which did not contain the abrasive grains, the polishing composition according to Comparative Example 2 which did not contain the water-soluble polymer having no alcoholic hydroxyl group in a side chain, the polishing compositions according to Comparative Examples 3 and 5 which did not contain the polyvalent carboxylic acid (salt), and in the polishing composition according to Comparative Example 4 which did not contain the oxidizing agent, at least one selected from the group consisting of the polishing speed of the SiGe substrate, the selective ratio of SiGe/poly-Si, and the selective ratio SiGe/SiO$_2$ was confirmed to be outside of the range of the excellent results described above. From these results, it is conjectured that the polishing compositions according to Comparative Examples 1 to 5 are unsatisfactory in polishing efficiency of the objects to be polished containing SiGe, or unsatisfactory in reduction effects on steps and dishing in the objects to be polished containing SiGe and at least one selected from the group consisting of poly-Si and SiO$_2$ (poly-Si, SiO$_2$, or both thereof), or unsatisfactory in all of these.

The present application is based on Japanese Patent Application No. 2021-077571 filed on Apr. 30, 2021, and Japanese Patent Application No. 2022-047909 filed on Mar. 24, 2022, and the entire contents of which are incorporated by reference herein.

The invention claimed is:

1. A polishing composition comprising:
abrasive grains consisting of silica abrasive grains with organic acid immobilized on its surface;
polypropylene glycol present in the polishing composition at a concentration of 2 g/L or higher;
a water-soluble polymer having an alcoholic hydroxyl group in a side chain present in the polishing composition at a concentration of 1 g/L or lower, wherein the water-soluble polymer having an alcoholic hydroxyl group in a side chain consist of at least one selected from the group consisting of polyvinyl alcohol and a sulfonic acid-modified polyvinyl alcohol;
a polyvalent carboxylic acid (salt) containing a salt of a polyvalent carboxylic acid and the salt of the polyvalent carboxylic acid consists of a salt of citric acid; and
hydrogen peroxide, and
having a pH of 2.5 or more and 4 or less.

2. The polishing composition according to claim 1, wherein a weight-average molecular weight of the polypropylene glycol is lower than 1,000.

3. The polishing composition according to claim 1, wherein the polyvalent carboxylic acid (salt) contains an ammonium salt of citric acid.

4. The polishing composition according to claim 1, wherein the polishing composition has a selective ratio of SiGe/poly-Si, which is a ratio of a polishing speed of a SiGe substrate to a polishing speed of a poly-Si substrate, of 1.4 or more and 1.7 or less.

5. The polishing composition according to claim 1, wherein the polishing composition has a selective ratio of SiGe/SiO$_2$, which is a ratio of a polishing speed of a SiGe substrate to a polishing speed of a SiO$_2$ substrate, of 1.2 or more and 2.0 or less.

* * * * *